(12) United States Patent
Kim

(10) Patent No.: US 10,448,513 B2
(45) Date of Patent: Oct. 15, 2019

(54) DISPLAY DEVICE

(71) Applicant: SAMSUNG DISPLAY CO., LTD., Yongin-si, Gyeonggi-do (KR)

(72) Inventor: Sang Woo Kim, Cheonan-si (KR)

(73) Assignee: SAMSUNG DISPLAY CO., LTD., Yongin-si, Gyeonggi-do (KR)

( * ) Notice: Subject to any disclaimer, the term of this patent is extended or adjusted under 35 U.S.C. 154(b) by 37 days.

(21) Appl. No.: 15/453,129

(22) Filed: Mar. 8, 2017

(65) Prior Publication Data

US 2017/0265301 A1    Sep. 14, 2017

(30) Foreign Application Priority Data

Mar. 10, 2016 (KR) .................. 10-2016-0028963

(51) Int. Cl.
*H05K 1/18* (2006.01)
*G02F 1/1345* (2006.01)
*H05K 1/14* (2006.01)
*H05K 3/32* (2006.01)

(52) U.S. Cl.
CPC ......... *H05K 1/189* (2013.01); *G02F 1/13452* (2013.01); *H05K 1/147* (2013.01); *H05K 3/323* (2013.01); *H05K 2201/10128* (2013.01)

(58) Field of Classification Search
USPC ....................................................... 361/749
See application file for complete search history.

(56) References Cited

U.S. PATENT DOCUMENTS

2009/0167171 A1    7/2009  Jung et al.
2011/0267792 A1*  11/2011  Kim ................... G02F 1/13452
                                                            361/783
2016/0300545 A1*  10/2016  Kim ....................... G09G 3/006

FOREIGN PATENT DOCUMENTS

KR    10-2013-0004085 A    1/2013
KR    10-2014-0118222 A   10/2014
KR    10-2015-0074453 A    7/2015

* cited by examiner

*Primary Examiner* — Andargie M Aychillhum
(74) *Attorney, Agent, or Firm* — Lee & Morse, P.C.

(57) ABSTRACT

A display device includes a display substrate with a display area, a first peripheral area, and a second peripheral area, the display area having first and second sides extending in directions crossing each other, the first peripheral area adjacent to the first side, and the second peripheral area adjacent to the second side, a first driving substrate attached to the first peripheral area, the first driving substrate including a first driving circuit portion and a first link wire connected to the first driving circuit portion, a second driving substrate attached to the second peripheral area, the second driving substrate including a second driving circuit portion and a second link wire connected to the second driving circuit portion, and a flexible circuit board attached to the first driving substrate, the flexible circuit board including a third link wire connected to the first and second link wires.

7 Claims, 20 Drawing Sheets

DISPLAY DEVICE

CROSS-REFERENCE TO RELATED APPLICATION

Korean Patent Application No. 10-2016-0028963, filed on Mar. 10, 2016, in the Korean Intellectual Property Office, and entitled: "Display Device," is incorporated by reference herein in its entirety.

BACKGROUND

1. Field

Embodiment of the present disclosure relate to a display device. More particularly, the present disclosure relates to a display device that may reduce a peripheral area in which an image is not displayed.

2. Description of the Related Art

Recently, various display devices such as a liquid crystal display, an organic light emitting diode display, etc. have been commercially available. In the display devices, a technique for minimizing a bezel size around a display area, i.e., a peripheral area thereof, has been under development. The peripheral area corresponds to a remaining area excluding the display area. As the bezel size increases, an entire size of the display device may increase. Various wires for driving the display device are disposed in the bezel, and minimizing of the bezel size is limited due to the wires.

SUMMARY

Embodiments provide a display device that may reduce a bezel size around a display area.

An exemplary embodiment provides a display device, including a display substrate configured to include a display area including a first side and a second side extending in directions crossing each other, a first peripheral area adjacent to the first side, and a second peripheral area adjacent to the second side; a first driving substrate configured to be attached to the first peripheral area and to include a first driving circuit portion and a first link wire connected to the first driving circuit portion; a second driving substrate configured to be attached to the second peripheral area and to include a second driving circuit portion and a third link wire connected to the second driving circuit portion; and a flexible circuit board configured to be attached to the first driving substrate and to include a second link wire connected to the first link wire and the third link wire.

The first peripheral area and the second peripheral area may be folded to a rear surface of the display substrate.

The display area may include a plurality of gate lines extending in a first direction, and the second driving circuit portion may be connected to the plurality of gate lines.

The display area may include a plurality of data lines extending in a second direction, and the first driving circuit portion is connected to the plurality of data lines.

The first driving substrate may include a first signal input wire connected to the first driving circuit portion, and the flexible circuit board may include a second signal input wire connected to the first signal input wire.

The display substrate may include a third peripheral area adjacent to a third side of the display area, the third side of the display area may face the second side with the display area therebetween, and the display device may further include a third driving substrate configured to be attached to the third peripheral area and to include a sixth link wire connected to a third driving circuit portion and the first driving circuit portion.

The first driving substrate may include a fourth link wire connected to the first driving circuit portion, and the flexible circuit board may include a fifth link wire connected to the fourth link wire and the sixth link wire.

Another embodiment provides a display device, including a display substrate configured to include a display area including a first side and a second side extending in directions crossing each other, a first peripheral area adjacent to the first side of the display area, and a second peripheral area adjacent to the second side of the display area; a first driving substrate configured to be attached to the first peripheral area and to include a first driving circuit portion and a first link wire connected to the first driving circuit portion; and a second driving substrate configured to be attached to the second peripheral area and to include a second driving circuit portion and a third link wire connected to the second driving circuit portion, wherein the first driving substrate and the second driving substrate may overlap each other on a rear surface of the display substrate, and the first link wire and the third link wire may be connected to each other through a region in which the first driving substrate and the second driving substrate overlap each other.

The first peripheral area and the second peripheral area may be folded to a rear surface of the display substrate.

The display area may include a plurality of gate lines extending in a first direction and a plurality of data lines extending in a second direction, the first driving circuit portion may be connected to the plurality of data lines, and the second driving circuit portion may be connected to the plurality of gate lines.

Yet another embodiment provides a display device, including a display substrate configured to include a display area including a first side and a second side extending in directions crossing each other, a first peripheral area adjacent to the first side of the display area, and a second peripheral area adjacent to the second side of the display area; and a driving substrate configured to be attached to the first peripheral area and the second peripheral area on a rear surface of the display substrate and to include a first driving circuit portion, a second driving circuit portion, and a link wire connecting the first driving circuit portion and the second driving circuit portion, wherein the display area may include a plurality of data lines and a plurality of gate lines, the first peripheral area may include a plurality of first fan-out wires connected to the plurality of data lines, the second peripheral area may include a plurality of second fan-out wires connected to the plurality of gate lines, the first driving circuit portion may be connected to the plurality of first fan-out wires, and the second driving circuit portion may be connected to the plurality of second fan-out wires.

The first peripheral area and the second peripheral area may be folded to a rear surface of the display substrate.

Still another embodiment provides a display device, including a display substrate configured to include a display area including a first side and a second side extending in directions crossing each other, a first peripheral area adjacent to the first side of the display area, and a second peripheral area adjacent to the second side of the display area; a first driving substrate configured to be attached to the first peripheral area and to include a first driving circuit portion and a first link wire connected to the first driving circuit portion; and a second driving substrate configured to be attached to the second peripheral area and to include a second driving circuit portion and a third link wire connected to the second driving circuit portion, wherein the first peripheral area may include a seventh link wire connected to the first link wire, the second peripheral area may include an eighth link wire connected to the third link wire, and the seventh link wire and the eighth link wire may be connected to each other in a region in which the first peripheral area and the second peripheral area overlap each other on a rear surface of the display substrate.

The first peripheral area and the second peripheral area may be folded to a rear surface of the display substrate.

The first peripheral area may include a first pad portion connected to the seventh link wire, the second peripheral area may include a second pad portion connected to the eighth link wire, and the first pad portion and the second pad portion may overlap at a rear surface of the display substrate.

The second peripheral area may include a contact hole provided at a position at which the first pad portion and the second pad portion overlap each other.

The first pad portion and the second pad portion may be electrically connected to each other through a conductor inserted into the contact hole.

The display area may include a plurality of gate lines extending in a first direction and a plurality of data lines extending in a second direction, the first peripheral area may include a plurality of first fan-out wires connected to the plurality of data lines and the first driving substrate, and the first driving substrate may include a plurality of first signal output wires connected to the first driving circuit portion and the plurality of first fan-out wires.

The second peripheral area may include the plurality of gate lines and a plurality of second fan-out wires connected to the second driving substrate, and the second driving substrate may include a plurality of second signal output wires connected to the second driving circuit portion and the plurality of second fan-out wires.

BRIEF DESCRIPTION OF THE DRAWINGS

Features will become apparent to those of ordinary skill in the art by describing in detail exemplary embodiments with reference to the attached drawings, in which.

DETAILED DESCRIPTION

Figure 1:
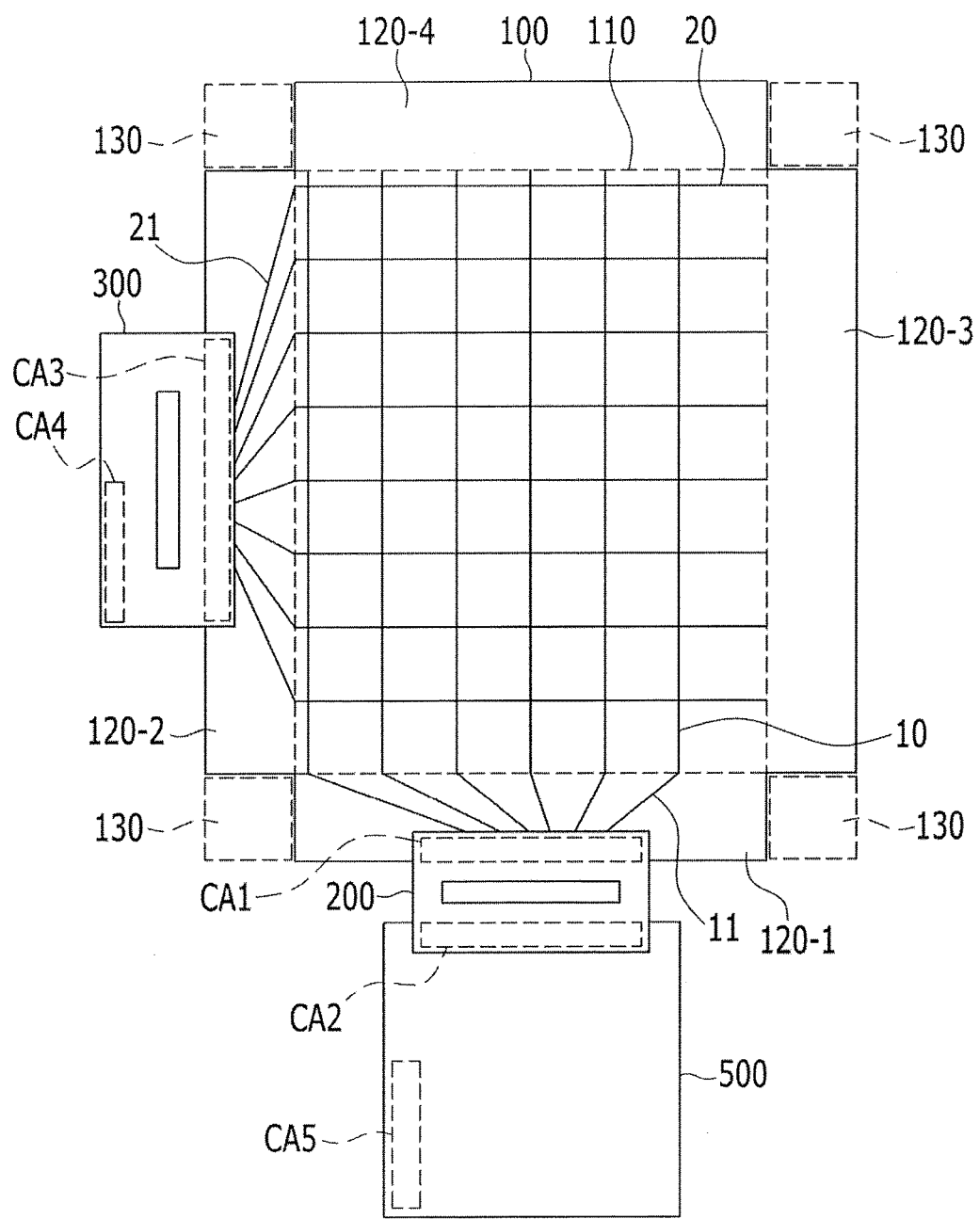
FIG. 1 illustrates a top plan view of a display device according to an exemplary embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. In addition, it will also be understood that when a layer is referred to as being "between" two layers, it can be the only layer between the two layers, or one or more intervening layers may also be present. Like reference numerals refer to like elements throughout.

Parts that are irrelevant to the description will be omitted to clearly describe embodiments. Throughout this specification and the claims that follow, when it is described that an element is "coupled" to another element, the element may be "directly coupled" to the other element or "electrically coupled" to the other element through a third element. Further, in the specification, the word "on" or "above" means positioned on or below the object portion, and does not necessarily mean positioned on the upper side of the object portion based on a gravitational direction.

In addition, unless explicitly described to the contrary, the word "comprise" and variations such as "comprises" or "comprising" will be understood to imply the inclusion of stated elements but not the exclusion of any other elements. Further, in the specification, the phrase "in a plan view" means when an object portion is viewed from above, and the phrase "in a cross-section" means when a cross-section taken by vertically cutting an object portion is viewed from the side.

Hereinafter, a display device according to an exemplary embodiment will be described in detail with reference to FIGS. 1 to 3.

FIG. 1 illustrates a top plan view of a display device according to an exemplary embodiment. FIG. 2 illustrates an enlarged top plan view of a first driving substrate and a flexible circuit board of the display device of FIG. 1. FIG. 3 illustrates an enlarged top plan view of a second driving substrate of the display device of FIG. 1.

In a manufactured display device, peripheral areas 120-1, 120-2, 120-3, and 120-4 are folded to a rear surface of a display substrate 100. In FIGS. 1 to 3, for better understanding and ease of description, a state in which the peripheral areas 120-1, 120-2, 120-3, and 120-4 are not folded to the rear surface of the display substrate 100 will be exemplarily described.

Figure 2:
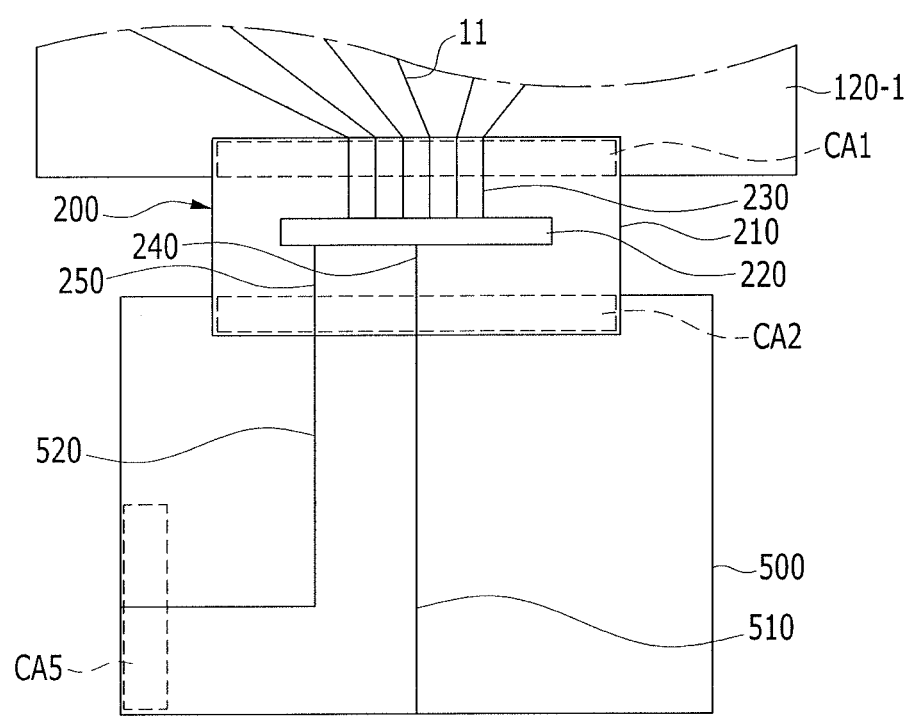
FIG. 2 illustrates an enlarged top plan view of a first driving substrate and a flexible circuit board of the display device of FIG. 1.
Figure 3:
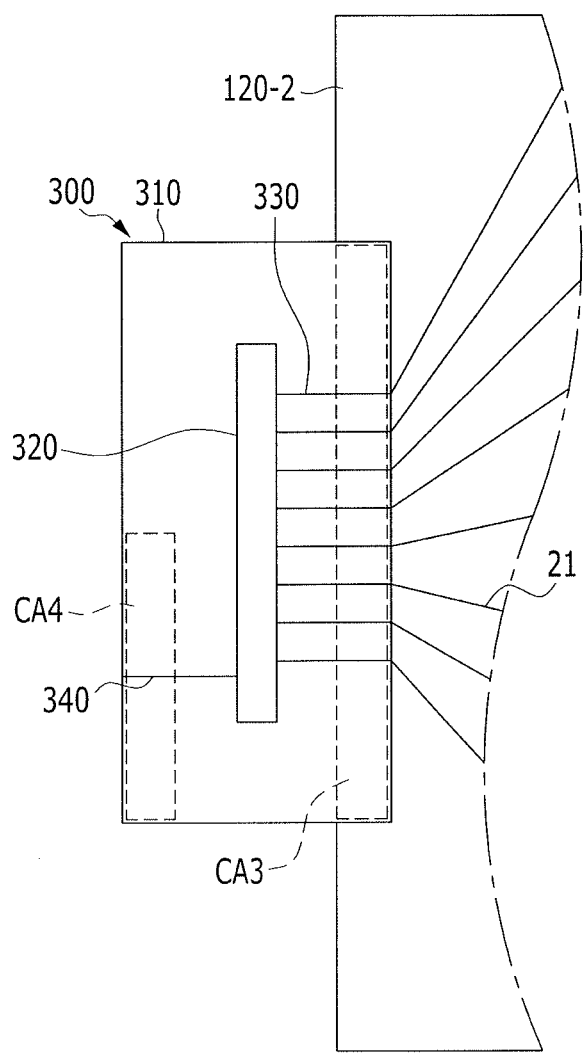
FIG. 3 illustrates an enlarged top plan view of a second driving substrate of the display device of FIG. 1.

Referring to FIGS. 1 to 3, a display device may include the display substrate 100, a first driving substrate 200, a second driving substrate 300, and a flexible circuit board 500.

The display substrate 100 includes a display area 110 and the peripheral areas 120-1, 120-2, 120-3, and 120-4 around the display area 110. For example, the display area 110 may be formed to have a substantially rectangular shape, and it may include a first side and a second side in directions crossing each other, and a third side and a fourth side respectively parallel to the second side and the first side. The first side may face the fourth side, and the second side may face the third side.

The display area 110 includes a plurality of data lines 10 and a plurality of gate lines 20. The plurality of gate lines 20 may extend in a first direction, and the plurality of data lines 10 may extend in a second direction crossing the first direction. For example, the first direction may be a row direction, and the second direction may be a column direction, and the first direction and the second direction are perpendicular to each other. A base substrate of the display substrate 100 may be made of, e.g., a flexible plastic material and the like.

The peripheral areas 120-1, 120-2, 120-3, and 120-4 include a first peripheral area 120-1 adjacent to the first side of the display area 110, a second peripheral area 120-2 adjacent to the second side of the display area 110, a third peripheral area 120-3 adjacent to the third side of the display area 110, and a fourth peripheral area 120-4 adjacent to the fourth side of the display area 110. The four peripheral areas 120-1, 120-2, 120-3, and 120-4 may be separated from each other by cutting regions 130. The cutting regions 130 correspond to corner portions of the display substrate 100 that are cut based on an extension line of a border of the display area 110. That is, the cut corner portions are the cutting regions 130, i.e., quadrangular portions in FIG. 1 indicated by dashed lines.

The first peripheral area 120-1 may face the fourth peripheral area 120-4 in the second direction with the display area 110 therebetween. The second peripheral area 120-2 may face the third peripheral area 120-3 in the first direction with the display area 110 therebetween.

The first driving substrate 200 is attached to the first peripheral area 120-1, and the second driving substrate 300 is attached to the second peripheral area 120-2. The flexible circuit board 500 is connected to the first driving substrate 200.

Referring to FIG. 2, the first driving substrate 200 includes a first film portion 210, a first driving circuit portion 220, a plurality of first signal output wires 230, a first signal input wire 240, and a first link wire 250. The first film portion 210 includes a first connecting region CA1 overlapping the first peripheral area 120-1, and a second connecting region CA2 overlapping the flexible circuit board 500. The first driving substrate 200 and the first peripheral area 120-1 are connected to each other through the first connecting region CA1. The first driving substrate 200 and the flexible circuit board 500 are connected to each other through the second connecting region CA2.

The first driving circuit portion 220 may be disposed, e.g., on the first film portion 210, between the first connecting region CA1 and the second connecting region CA2. The first driving circuit portion 220 may include a driving chip for generating a signal for driving the display device. The plurality of first signal output wires 230 are connected to the first driving circuit portion 220, and extend to the first connecting region CA1. The first signal input wire 240 is connected to the first driving circuit portion 220 and extends to the second connecting region CA2. The first link wire 250 is connected to the first driving circuit portion 220, and extends to the second connecting region CA2.

The first peripheral area 120-1 includes a plurality of first fan-out wires 11 connected to the plurality of data lines 10 and the first driving substrate 200. The plurality of first fan-out wires 11 are respectively connected to the plurality of data lines 10. The plurality of first fan-out wires 11 are respectively connected to the plurality of first signal output wires 230 through the first connecting region CAL The flexible circuit board 500 includes a second signal input wire 510, a second link wire 520, and a fifth connecting region CA5. The second signal input wire 510 extends to the second connecting region CA2, and is connected to the first signal input wire 240 of the first driving substrate 200 through the second connecting region CA2. The second link wire 520 includes one end portion overlapping the second connecting region CA2 and another end portion overlapping the fifth connecting region CA5. The second link wire 520 is connected to the first link wire 250 of the first driving substrate 200 through the second connecting region CA2.

Referring to FIG. 3, the second driving substrate 300 includes a second film portion 310, a second driving circuit portion 320, a plurality of second signal output wires 330, and a third link wire 340. The second film portion 310 includes a third connecting region CA3 overlapping the second peripheral area 120-2, and a fourth connecting region CA4 overlapping the fifth connecting region CA5 of the flexible circuit board 500. The second driving substrate 300 and the second peripheral area 120-2 are connected to each other through the third connecting region CA3. The second driving circuit portion 320 may be disposed, e.g., on the second film portion 310, between the third connecting region CA3 and the fourth connecting region CA4.

The second driving circuit portion 320 may include a driving chip or a driving circuit for generating a gate signal applied to the plurality of gate lines 20. The plurality of second signal output wires 330 are connected to the second driving circuit portion 320, and extend to the third connecting region CA3. The third link wire 340 is connected to the second driving circuit portion 320, and extends to the fourth connecting region CA4.

The second peripheral area 120-2 includes a plurality of second fan-out wires 21 connected to the plurality of gate lines 20 and the second driving substrate 300. The plurality of second fan-out wires 21 are respectively connected to the plurality of gate lines 20. The plurality of second fan-out wires 21 are respectively connected to the plurality of second signal output wires 330 through the third connecting region CA3.

It is exemplarily described above that the first signal input wire 240 and the second signal input wire 510 are respectively singular, but the present disclosure is not limited thereto, and the first signal input wire 240 and the second signal input wire 510 may respectively be plural according to the number of signals necessary for driving and controlling the display device. Moreover, it is exemplarily described that the first link wire 250, the second link wire 520, and the third link wire 340 are respectively singular, but the present disclosure is not limited thereto, and the first link wire 250, the second link wire 520, and the third link wire 340 may respectively be plural according to the number of signals transmitted between the first driving circuit portion 220 and the second driving circuit portion 320.

The peripheral areas 120-1, 120-2, 120-3, and 120-4 of the display substrate 100 are folded to a rear surface of the display substrate 100 based on a border between the display area 110 and the peripheral areas 120-1, 120-2, 120-3, and 120-4. That is, each of the peripheral areas 120-1, 120-2, 120-3, and 120-4 is folded away from the display area 110 toward a rear surface of the display substrate 100 along a corresponding border line (a dashed line in FIG. 1 separating each of the peripheral areas 120-1, 120-2, 120-3, and 120-4 from the display area 110).

Hereinafter, the display device in a state in which the peripheral areas 120-1, 120-2, 120-3, and 120-4 are folded to the rear surface will be described with reference to FIGS. 4 and 5.

Figure 4:
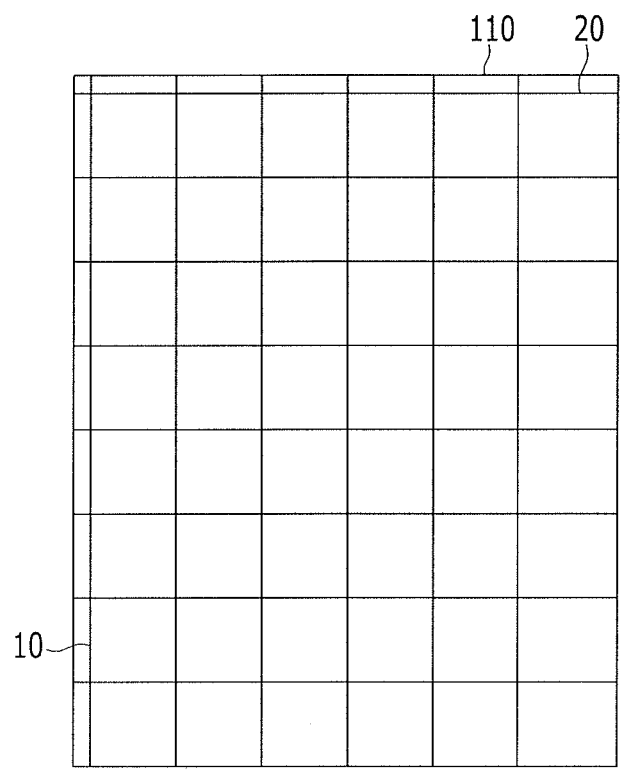
FIG. 4 illustrates a top plan view in a state in which a peripheral area of the display device of FIG. 1 is folded to a rear surface thereof.

FIG. 4 illustrates a top plan view in a state in which a peripheral area of the display device of FIG. 1 is folded to a rear surface thereof. FIG. 5 illustrates a rear view of the display device in the state in which the peripheral area of the display device is folded to the rear surface thereof, as shown in FIG. 4. In other words, FIGS. 4-5 illustrate opposite surfaces of the display device, when the peripheral areas are folded to the rear surface (FIG. 5).

Referring to FIG. 4, in the state in which the peripheral areas 120-1, 120-2, 120-3, and 120-4 are folded to the rear surface of the display substrate 100, only the display area 110 is viewed, e.g., visible, from the front of the display substrate 100, and the peripheral areas 120-1, 120-2, 120-3, and 120-4 are not viewed from the front of the display substrate 100. For example, as illustrated in FIG. 4, when the peripheral areas 120-1, 120-2, 120-3, and 120-4 are folded to the rear surface of the display substrate 100, only the display area 110 (represented by data and gate lines 10 and 20 in FIG. 4) displaying an image may be visible to a viewer.

Figure 5:
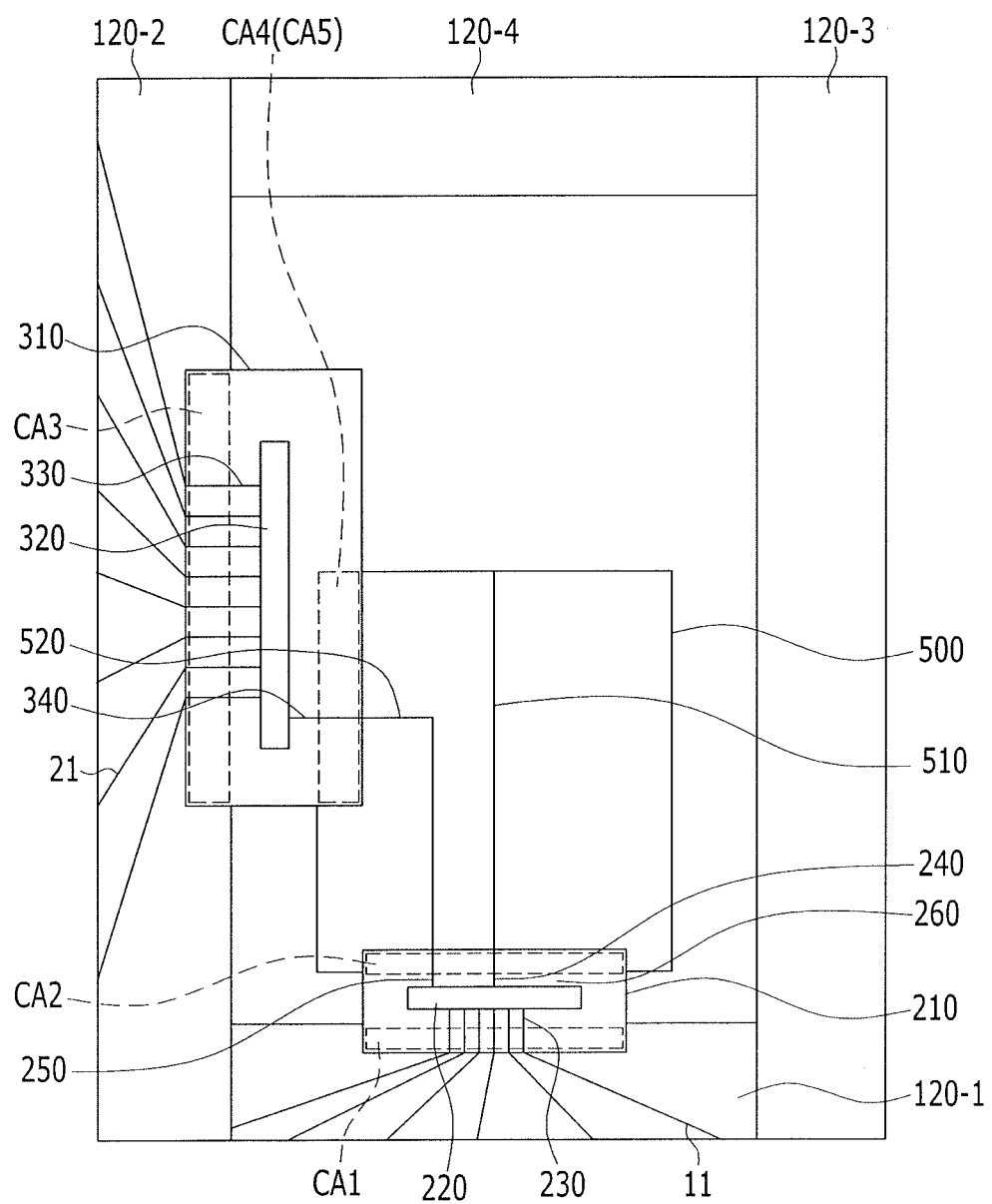
FIG. 5 illustrates a rear view of the display device in the state in which the peripheral area of the display device is folded to the rear surface thereof, as shown in FIG. 4.

Referring to FIG. 5, a state in which the first peripheral area 120-1 and the fourth peripheral area 120-4 are first folded to the rear surface of the display substrate 100, and then the second peripheral area 120-2 and the third peripheral area 120-3 are folded to the rear surface of the display substrate 100, will be exemplarily described. However, a folding order of the peripheral areas 120-1, 120-2, 120-3, and 120-4 is not limited thereto.

In the state in which the peripheral areas 120-1, 120-2, 120-3, and 120-4 are folded to the rear surface of the display substrate 100, the fourth connecting region CA4 of the second driving substrate 300 and the fifth connecting region CA5 of the flexible circuit board 500 overlap each other. The third link wire 340 of the second driving substrate 300 and the second link wire 520 of the flexible circuit board 500 are connected to each other through the overlapped fourth and fifth connecting regions CA4 and CA5. Resultantly, the first driving circuit portion 220 of the first driving substrate 200 and the second driving circuit portion 320 of the second driving substrate 300 are connected through the first link wire 250, the second link wire 520, and the third link wire 340.

As described above, the wires for connecting the first driving circuit portion 220 and the second driving circuit portion 320 are not disposed at the bezel of the display device, and they are disposed at the rear surface of the display substrate 100, thereby minimizing the bezel size without limitation of the wires. That is, a non-display area surrounding the display area 110 on a same plane as the display area 110 is minimized, e.g., or substantially eliminated, by folding such non-display area (accommodating wires) toward the rear surface and contact the rear surface of the display area. Accordingly, the area required for accommodating wires is not visible to a viewer and does not affect the size of the visible display area 110.

Hereinafter, a display device according to another exemplary embodiment will be described with reference to FIGS. 6 to 9. Compared with the display device according to the exemplary embodiment of FIGS. 1 to 5, only differences will be described.

Figure 6:
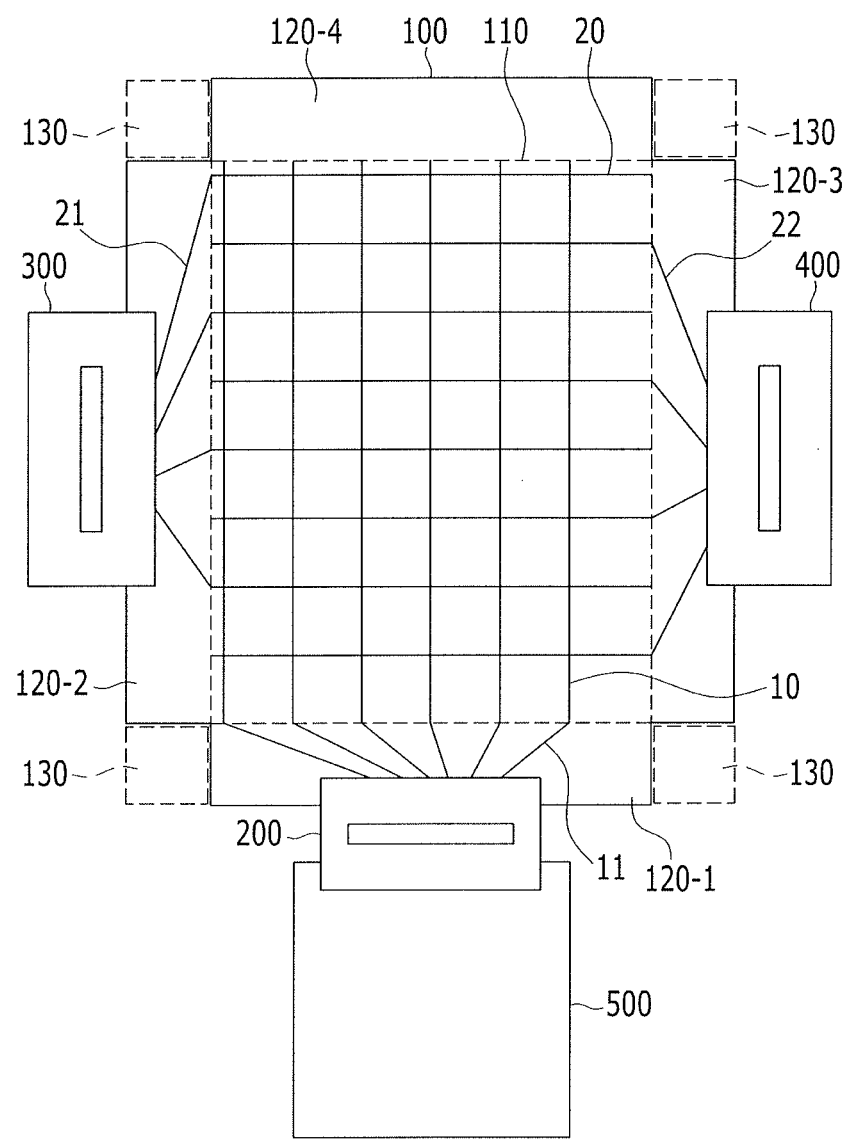
FIG. 6 illustrates a top plan view of a display device according to another exemplary embodiment.
Figure 7:
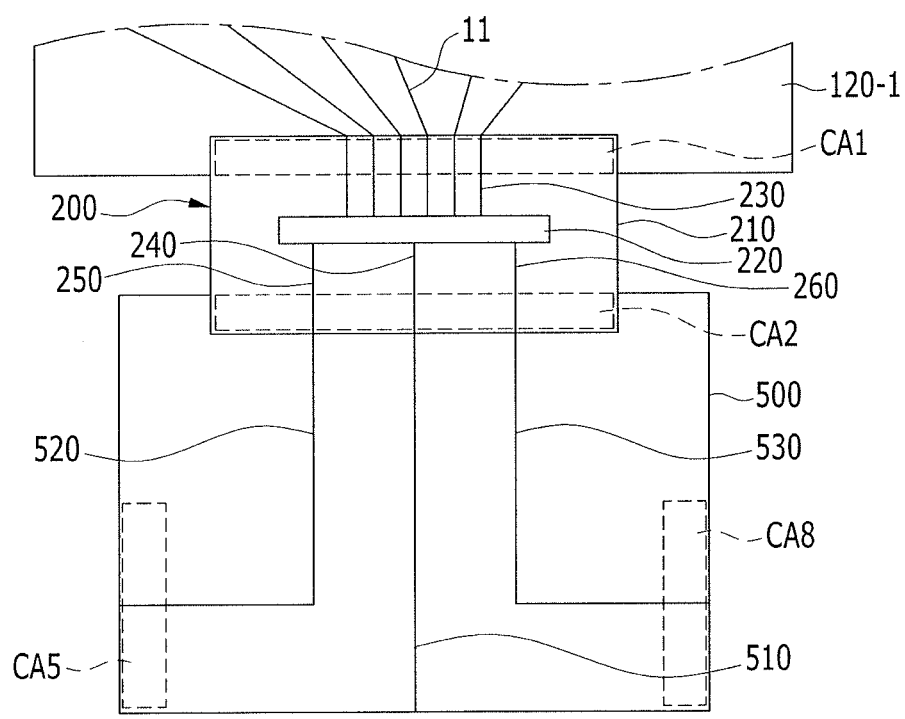
FIG. 7 illustrates an enlarged top plan view of a first driving substrate and a flexible circuit board of the display device of FIG. 6.
Figure 8:
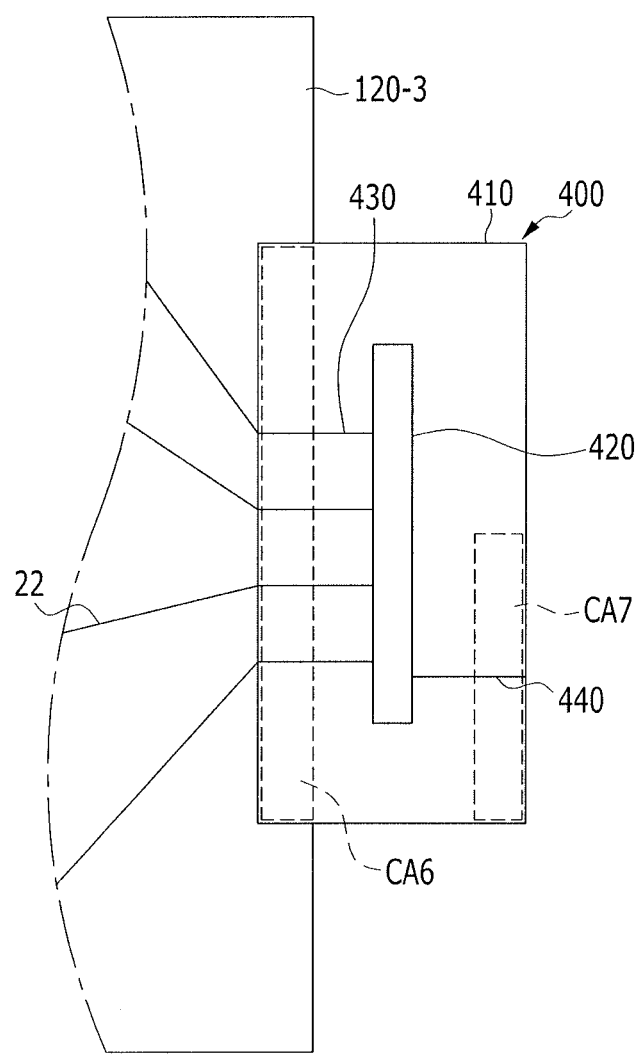
FIG. 8 illustrates an enlarged top plan view of a third driving substrate of the display device of FIG. 6.
Figure 9:
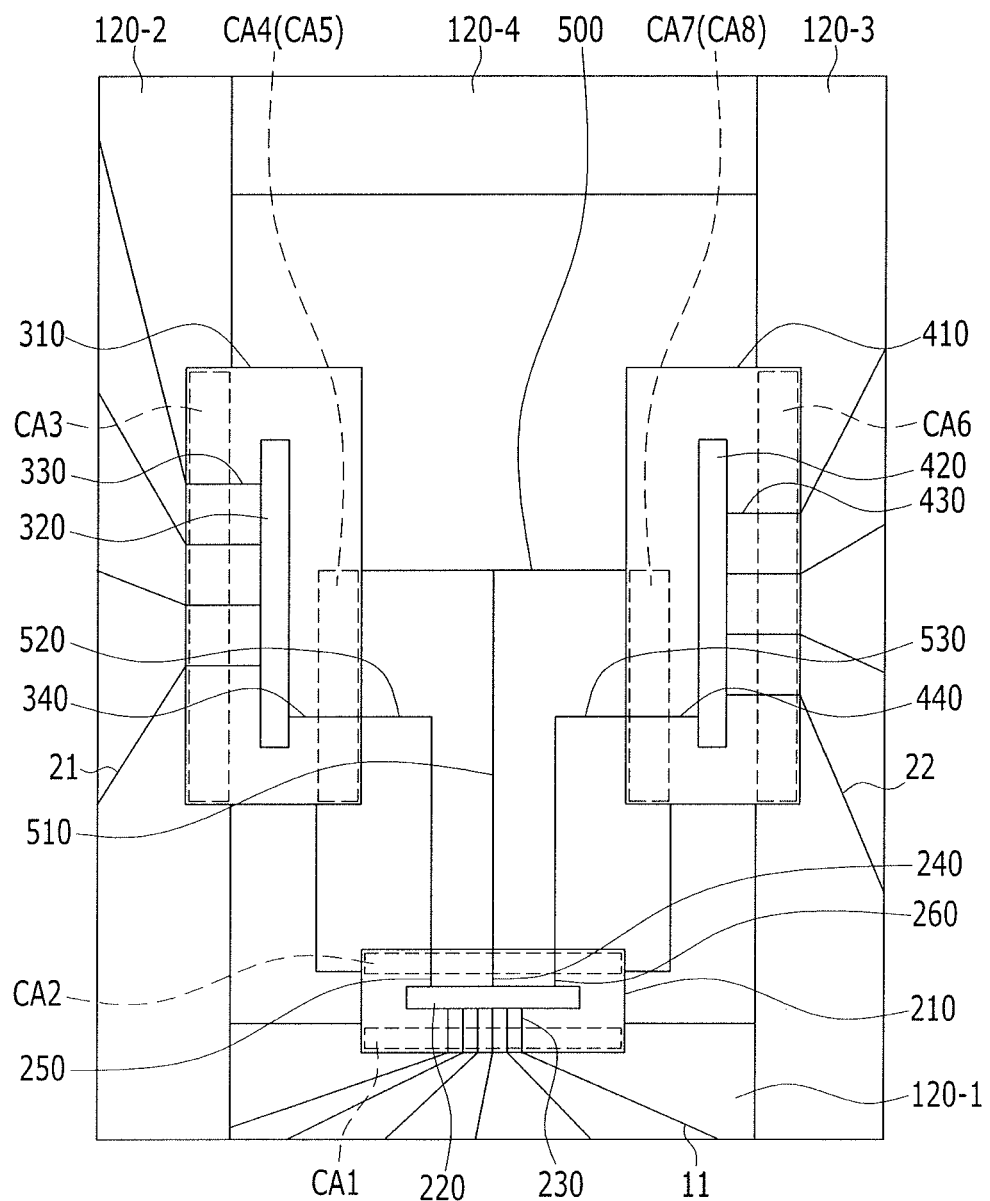
FIG. 9 illustrates a rear view of a display device in a state in which a peripheral area of the display device of FIG. 6 is folded to a rear surface thereof.

FIG. 6 illustrates a top plan view of a display device according to another exemplary embodiment. FIG. 7 illustrates an enlarged top plan view of a first driving substrate and a flexible circuit board of the display device of FIG. 6. FIG. 8 illustrates an enlarged top plan view of a third driving substrate of the display device of FIG. 6. FIG. 9 illustrates a rear view of a display device in a state in which a peripheral area of the display device of FIG. 6 is folded to a rear surface thereof.

Referring to FIGS. 6 to 9, as compared to the display device in FIGS. 1-5, the display device further includes a third driving substrate 400. The third driving substrate 400 is attached to the third peripheral area 120-3. The third peripheral area 120-3 includes a plurality of third fan-out wires 22 connected to the plurality of gate lines 20 and the third driving substrate 400. The plurality of third fan-out wires 22 are connected to some of the plurality of gate lines 20. For example, the plurality of third fan-out wires 22 are connected to even-numbered rows of the plurality of gate lines 20. In this case, the plurality of second fan-out wires 21 disposed in the second peripheral area 120-2 are connected to odd-numbered rows of the plurality of gate lines 20. That is, the plurality of second fan-out wires 21 and the plurality of third fan-out wires 22 are connected to different gate lines 20.

The first driving substrate 200 further includes a fourth link wire 260. The fourth link wire 260 is connected to the first driving circuit portion 220, and extends to the second connecting region CA2.

The flexible circuit board 500 further includes a fifth link wire 530 and an eighth connecting region CA8. The fifth link wire 530 includes one end portion overlapping the second connecting region CA2 and another end portion overlapping the eighth connecting region CA8. The fifth link wire 530 is connected to the fourth link wire 260 of the first driving substrate 200 through the second connecting region CA2.

The second driving substrate 300 is different from that of FIG. 3 in that the numbers of the plurality of second signal output wires 330 are different from each other, but their substantial configurations are the same, so a specific drawing for the second driving substrate 300 will be omitted.

The third driving substrate 400 includes a third film portion 410, a third driving circuit portion 420, a plurality of second signal output wires 430, and a sixth link wire 440.

The third film portion 410 includes a sixth connecting region CA6 overlapping the third peripheral area 120-3, and a seventh connecting region CA7 overlapping the eighth connecting region CA8 of the flexible circuit board 500. The third driving substrate 400 and the third peripheral area 120-3 are connected to each other through the sixth connecting region CA6. The third driving circuit portion 420 may be disposed between the sixth connecting region CA6 and the seventh connecting region CA7. The third driving circuit portion 420 may include a driving chip or a driving circuit for generating the gate signal applied to the plurality of gate lines 20. A plurality of third signal output wires 430 are connected to the third driving circuit portion 420, and extend to the sixth connecting region CA6. The plurality of third signal output wires 430 are respectively connected to the plurality of third fan-out wires 22 through the sixth connecting region CA6. The sixth link wire 440 is connected to the third driving circuit portion 420, and extends to the seventh connecting region CA7.

In the state in which the peripheral areas 120-1, 120-2, 120-3, and 120-4 are folded to the rear surface of the display substrate 100, the fourth connecting region CA4 of the second driving substrate 300 and the fifth connecting region CA5 of the flexible circuit board 500 overlap each other, and the seventh connecting region CA7 of the third driving substrate 400 and the eighth connecting region CA8 of the flexible circuit board 500 overlap each other. The third link wire 340 of the second driving substrate 300 and the second link wire 520 of the flexible circuit board 500 are connected to each other through the overlapped fourth and fifth connecting regions CA4 and CA5. In addition, the sixth link wire 440 of the third driving substrate 400 and the fifth link wire 530 of the flexible circuit board 500 are connected to each other through the overlapped seventh and eighth connecting regions CA7 and CA8. Resultantly, the first driving circuit portion 220 and the second driving circuit portion 320 are connected through the first link wire 250, the second link wire 520, and the third link wire 340, and the first driving circuit portion 220 and the third driving circuit portion 420 are connected through the fourth link wire 260, the fifth link wire 530, and the sixth link wire 440.

Hereinafter, a display device according to another exemplary embodiment will be described with reference to FIGS. 10 to 12. Compared with the display device according to the exemplary embodiment of FIGS. 1 to 5, only differences will be described.

Figure 10:
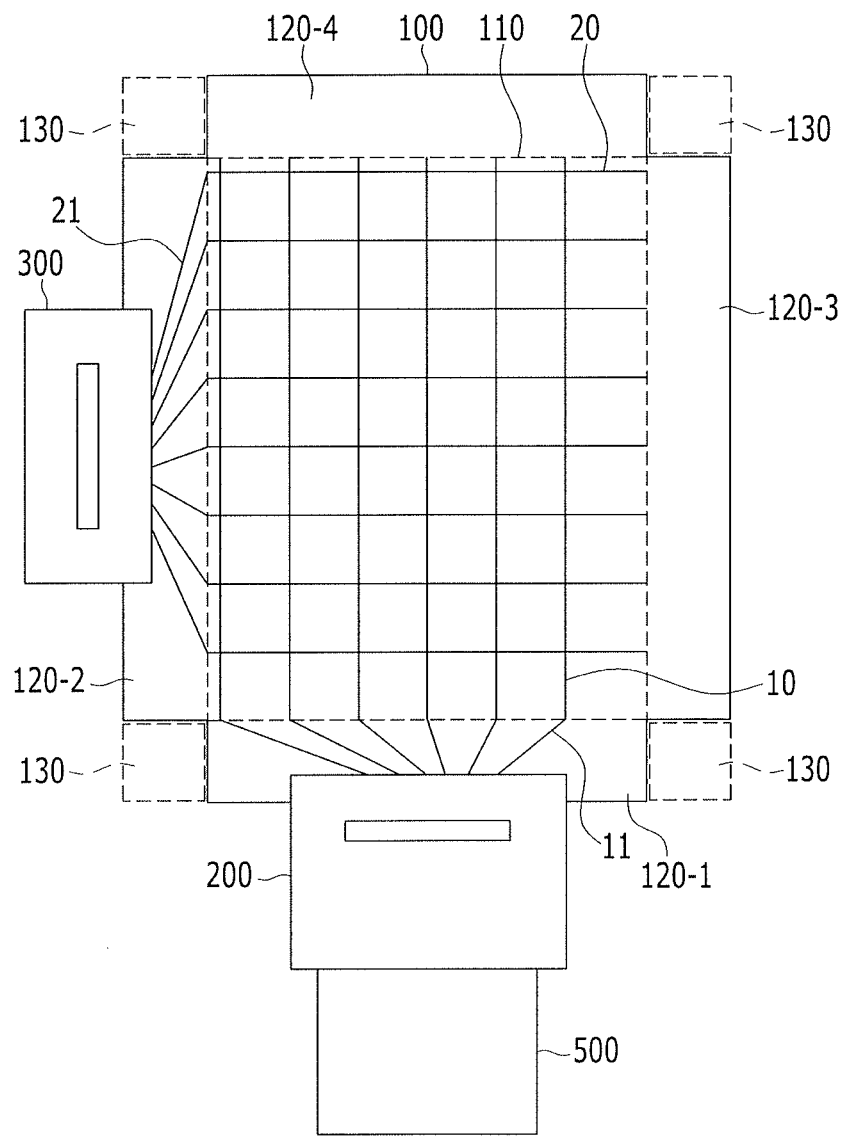
FIG. 10 illustrates a schematic top plan view of a display device according to another exemplary embodiment.

FIG. 10 illustrates a schematic top plan view of a display device according to another exemplary embodiment. FIG. 11 illustrates an enlarged top plan view of a first driving substrate and a flexible circuit board of the display device of FIG. 10. FIG. 12 illustrates a rear view of a display device in a state in which a peripheral area of the display device of FIG. 10 is folded to a rear surface thereof.

Figure 11:
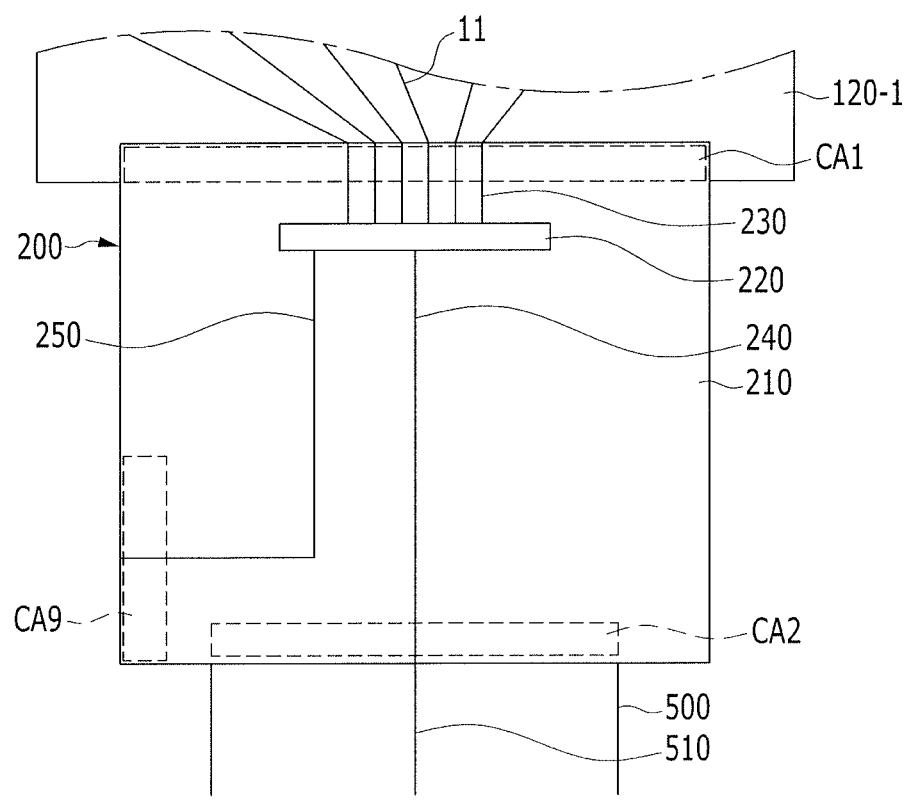
FIG. 11 illustrates an enlarged top plan view of a first driving substrate and a flexible circuit board of the display device of FIG. 10.
Figure 12:
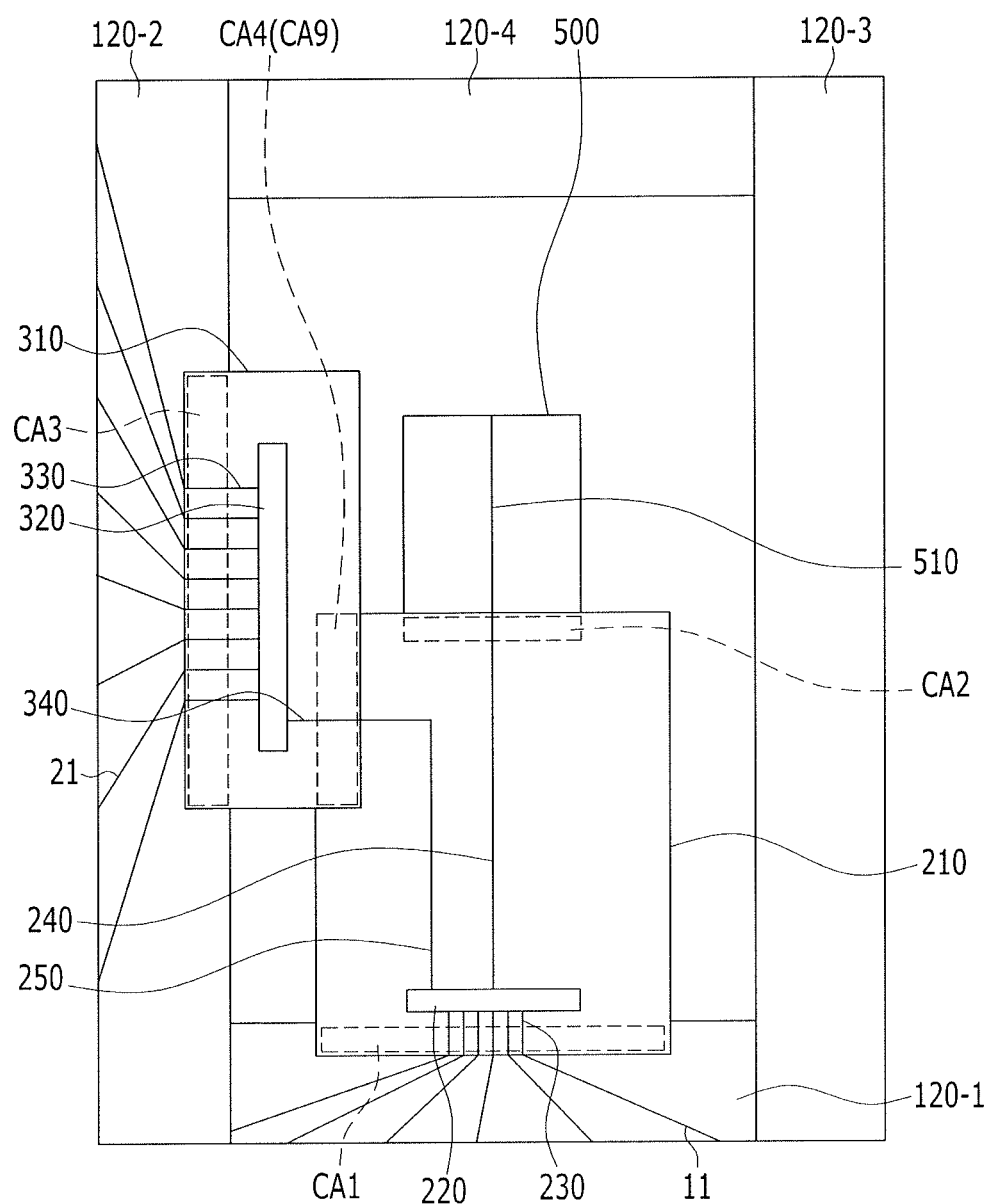
FIG. 12 illustrates a rear view of a display device in a state in which a peripheral area of the display device of FIG. 10 is folded to a rear surface thereof.

Referring to FIGS. 10 to 12, the first film portion 210 of the first driving substrate 200 has a relatively wider width in a row direction and a column direction. In addition, the flexible circuit board 500 has a relatively narrower width in the row direction.

The first film portion 210 of the first driving substrate 200 further includes a ninth connecting region CA9. The ninth connecting region CA9 corresponds to a portion overlapping the fourth connecting region CA4 of the second driving substrate 300. The first link wire 250 includes one end portion connected to the first driving circuit portion 220 and another end portion overlapping the ninth connecting region CA9.

The flexible circuit board 500 includes the second signal input wire 510. The flexible circuit board 500 does not include the second link wire 520 and the fifth connecting region CA5 illustrated in FIG. 1.

In the state in which the peripheral areas 120-1, 120-2, 120-3, and 120-4 are folded to the rear surface of the display substrate 100, the fourth connecting region CA4 of the second driving substrate 300 and the ninth connecting region CA9 of the first driving substrate 200 overlap each other. The third link wire 340 of the second driving substrate 300 and the first link wire 250 of the first driving substrate 200 are connected to each other through the overlapped fourth and ninth connecting regions CA4 and CA9. Resultantly, the first driving circuit portion 220 of the first driving substrate 200 and the second driving circuit portion 320 of the second driving substrate 300 are connected through the first link wire 250 and the third link wire 340.

Figure 13:
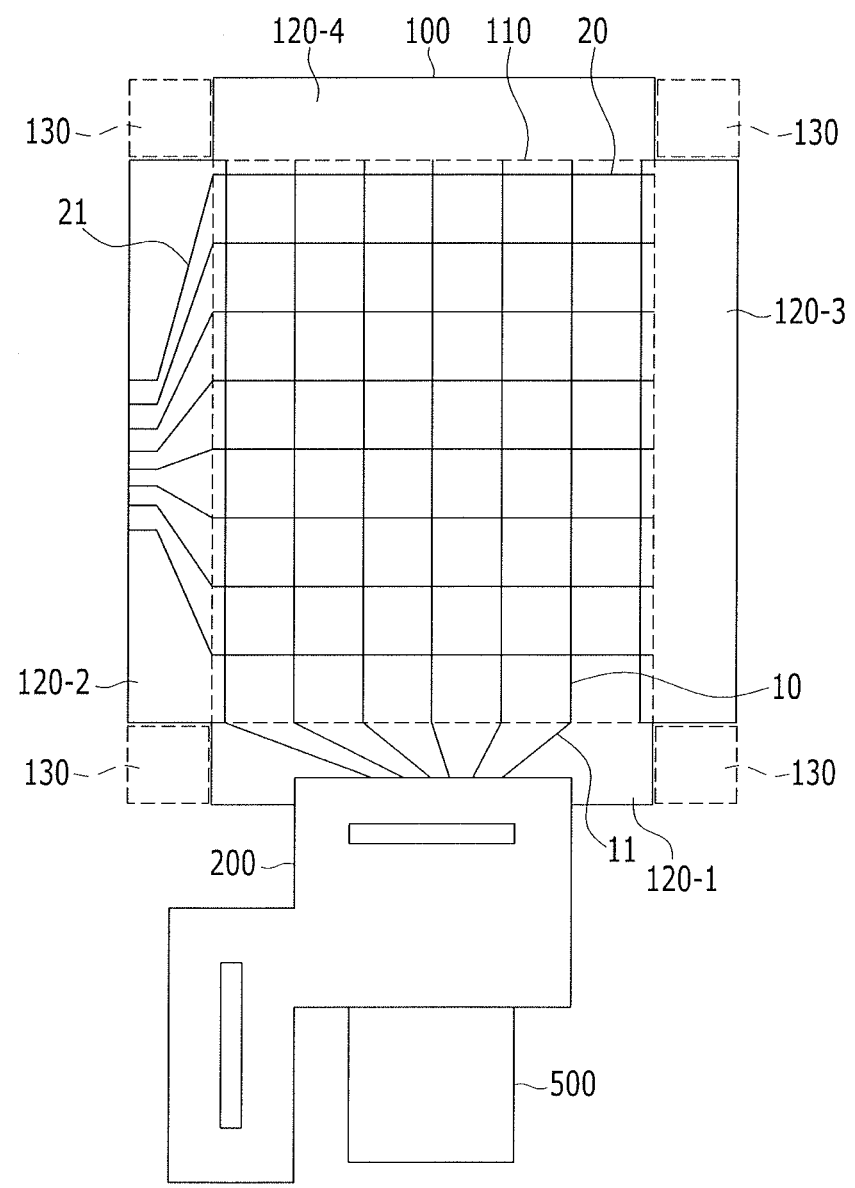
FIG. 13 illustrates a schematic top plan view of a display device according to another exemplary embodiment.
Figure 14:
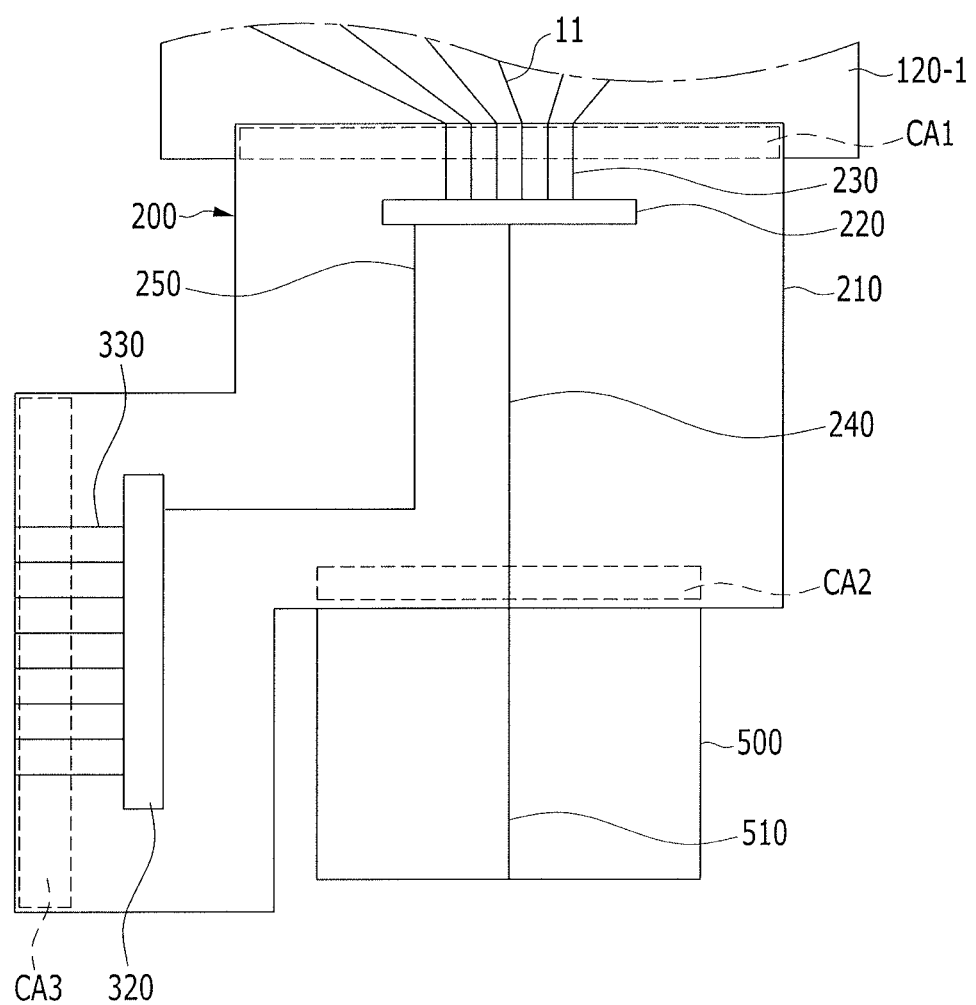
FIG. 14 illustrates an enlarged top plan view of a first driving substrate and a flexible circuit board of the display device of FIG. 13.
Figure 15:
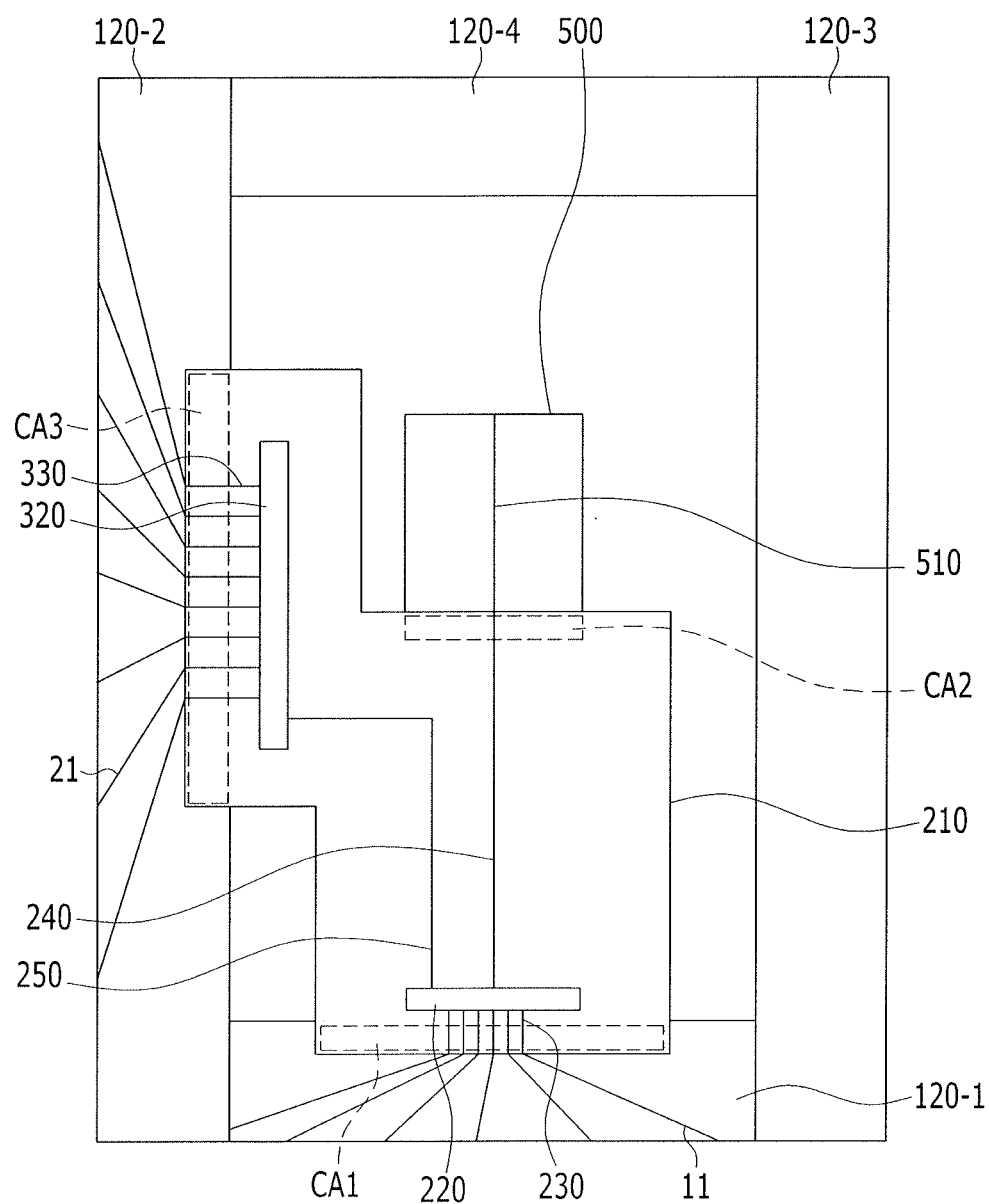
FIG. 15 illustrates a rear view of a display device in a state in which a peripheral area of the display device of FIG. 13 is folded to a rear surface thereof.

Hereinafter, a display device according to another exemplary embodiment will be described with reference to FIGS. 13 to 15. In FIGS. 13 to 15, the first driving substrate 200 and the second driving substrate 300 of the display device of FIGS. 10 to 12 are integrated, and compared with the display device according to the exemplary embodiment of FIGS. 10 to 12, only differences will be described.

FIG. 13 illustrates a schematic top plan view of a display device according to another exemplary embodiment. FIG. 14 illustrates an enlarged top plan view of a first driving substrate and a flexible circuit board of the display device of FIG. 13. FIG. 15 illustrates a rear view of a display device in a state in which a peripheral area of the display device of FIG. 13 is folded to a rear surface thereof.

The second driving substrate 300 of the display device of FIGS. 10 to 12 is omitted in FIGS. 13 to 15, wherein the first driving substrate 200 includes the first film portion 210, the first driving circuit portion 220, the plurality of first signal output wires 230, the first signal input wire 240, the first link wire 250, the second driving circuit portion 320, and the plurality of second signal output wires 330. The first film portion 210 includes the first connecting region CA1 overlapping the first peripheral area 120-1, the second connecting region CA2 overlapping the flexible circuit board 500, and the third connecting region CA3 overlapping the second peripheral area 120-2.

The first link wire 250 is positioned on the first film portion 210, and includes one end portion connected to the first driving circuit portion 220 and another end portion connected to the second driving circuit portion 320. That is, the first link wire 250 directly connects the first driving circuit portion 220 and the second driving circuit portion 320.

In the state in which the peripheral areas 120-1, 120-2, 120-3, and 120-4 are folded to the rear surface of the display substrate 100, the third connecting region CA3 of the first film portion 210 of the first driving substrate 200 overlaps the second peripheral area 120-2. The first driving substrate 200 and the second peripheral area 120-2 are connected through the overlapped third connecting region CA3. The plurality of second signal output wires 330 connected to the second driving circuit portion 320 are respectively connected to the plurality of second fan-out wires 21 through the third connecting region CA3.

As such, the first driving substrate 200 is attached to the first peripheral area 120-1 and the second peripheral area 120-2 in the rear surface of the display substrate 100.

Hereinafter, a display device according to another exemplary embodiment will be described with reference to FIGS.

16 to 20. Compared with the display device according to the exemplary embodiment of FIGS. 1 to 5, only differences will be described.

Figure 16:
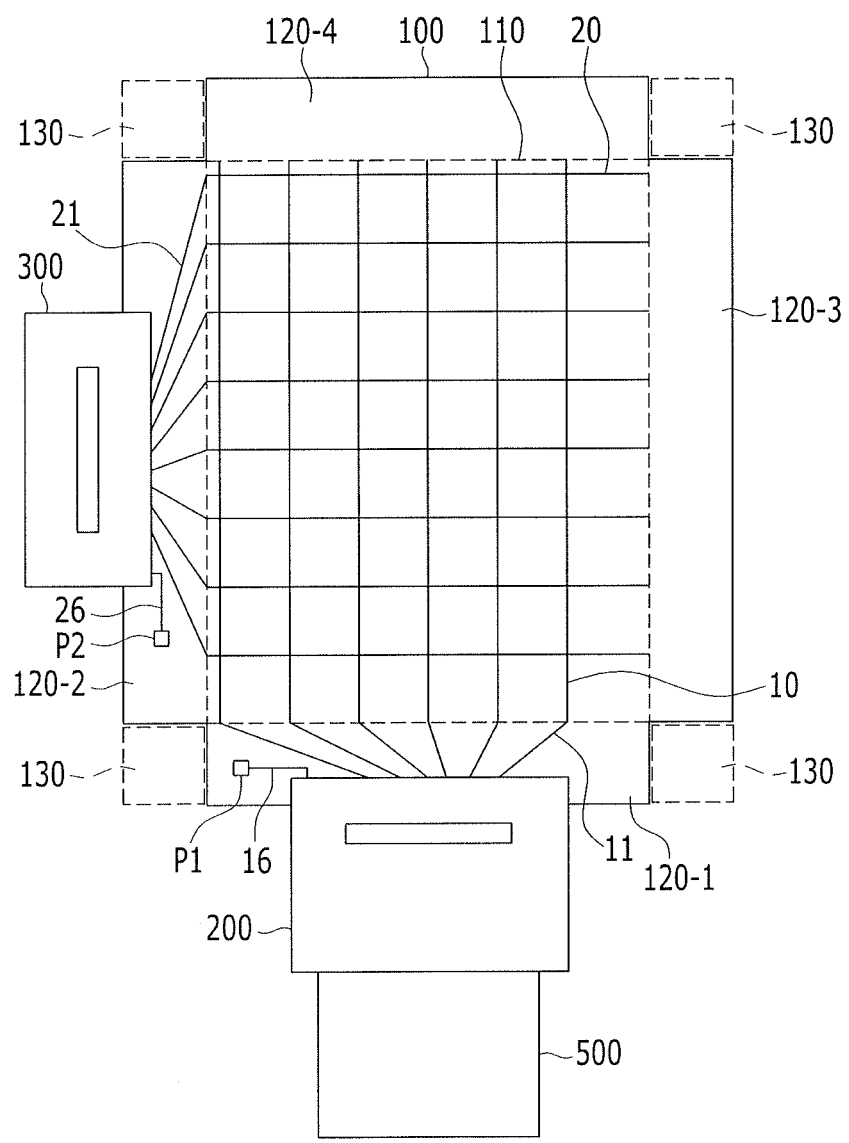
FIG. 16 illustrates a schematic top plan view of a display device according to another exemplary embodiment.
Figure 17:
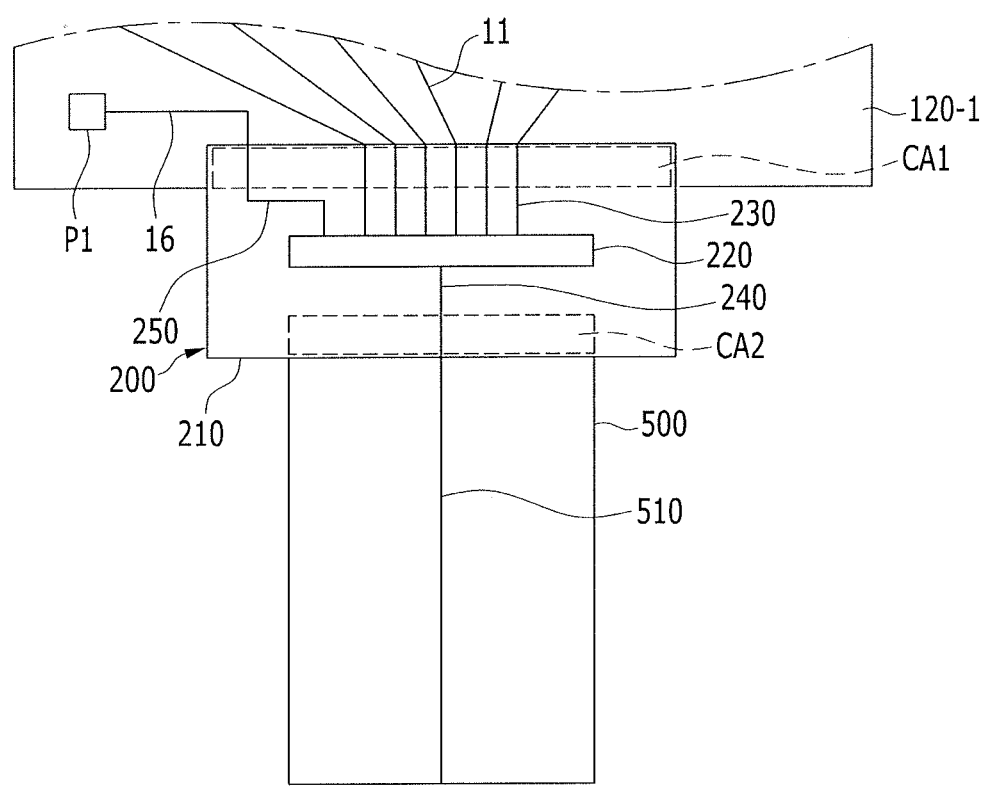
FIG. 17 illustrates an enlarged top plan view of a first driving substrate and a flexible circuit board of the display device of FIG. 16.
Figure 18:
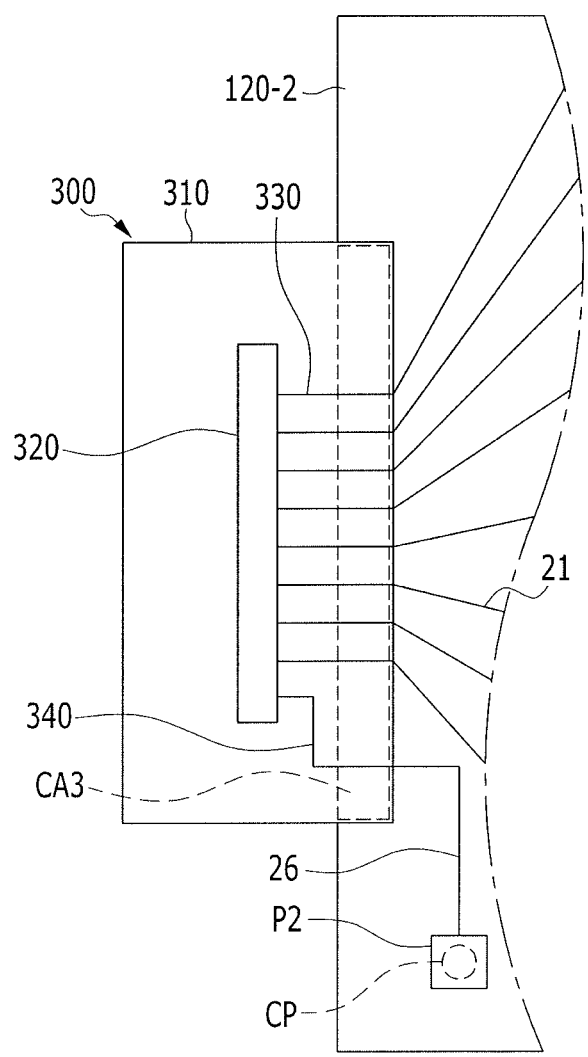
FIG. 18 illustrates an enlarged top plan view of a second driving substrate of the display device of FIG. 16.
Figure 19:
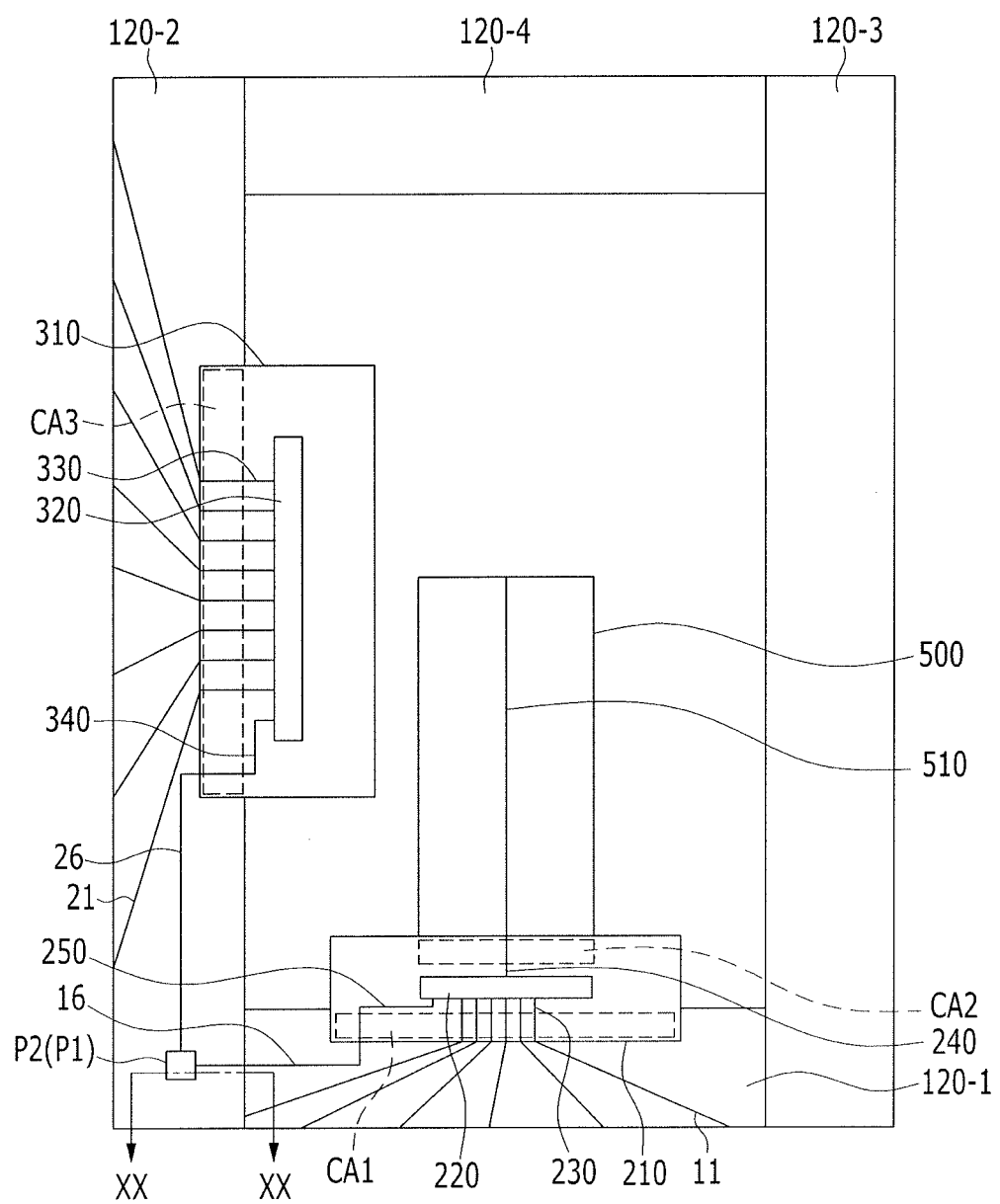
FIG. 19 illustrates a rear view of a display device in a state in which a peripheral area of the display device of FIG. 16 is folded to a rear surface thereof.
Figure 20:
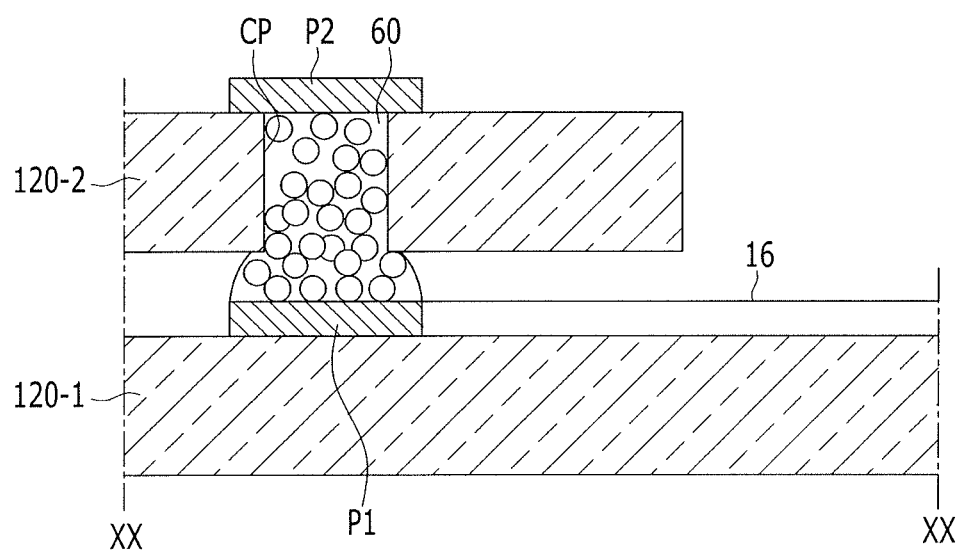
FIG. 20 illustrates a cross-sectional view taken along line XX-XX of FIG. 19.

FIG. 16 illustrates a schematic top plan view of a display device according to another exemplary embodiment. FIG. 17 illustrates an enlarged top plan view of a first driving substrate and a flexible circuit board of the display device of FIG. 16. FIG. 18 illustrates an enlarged top plan view of a second driving substrate of the display device of FIG. 16. FIG. 19 illustrates a rear view of a display device in a state in which a peripheral area of the display device of FIG. 16 is folded to a rear surface thereof. FIG. 20 illustrates a cross-sectional view taken along line XX-XX of FIG. 19.

Referring FIGS. 16 to 20, the first peripheral area 120-1 further includes a seventh link wire 16 connected to the first driving substrate 200 and a first pad portion P1. The seventh link wire 16 includes one end portion connected to the first pad portion P1 and another end portion overlapping the first connecting region CA1. The first pad portion P1, when the peripheral areas 120-1, 120-2, 120-3, and 120-4 are folded to the rear surface of the display substrate 100, is positioned where the first peripheral area 120-1 and the second peripheral area 120-2 overlap each other.

The second peripheral area 120-2 further includes an eighth link wire 26 connected to the second driving substrate 300 and a second pad portion P2. The eighth link wire 26 includes one end portion connected to the second pad portion P2 and another end portion overlapping the third connecting region CA3. The second pad portion P2 is positioned where it may overlap the first pad portion P1 of the first peripheral area 120-1 when the peripheral areas 120-1, 120-2, 120-3, and 120-4 are folded to the rear surface of the display substrate 100. The second peripheral area 120-2 includes a contact hole (CP) formed where the first pad portion P1 and the second pad portion P2 overlap each other. The second pad portion P2 may be disposed to cover the contact hole (CP).

The first link wire 250 of the first driving substrate 200 includes one end portion connected to the first driving circuit portion 220 and another end portion overlapping the first connecting region CA1. The first link wire 250 is connected to the seventh link wire 16 through the first connecting region CA1.

The third link wire 340 of the second driving substrate 300 includes one end portion connected to the second driving circuit portion 320 and another end portion overlapping the third connecting region CA3. The third link wire 340 is connected to the eighth link wire 26 through the third connecting region CA3.

Compared with the display device of FIGS. 1 to 5, the flexible circuit board 500 may have a relatively narrower width in the row direction. In addition, the flexible circuit board 500 does not include the second link wire 520 and the fifth connecting region CA5. Further, the second driving substrate 300 does not include the fourth connecting region CA4.

When the peripheral areas 120-1, 120-2, 120-3, and 120-4 are folded to the rear surface of the display substrate 100, the first pad portion P1 and the second pad portion P2 overlap each other. The contact hole (CP), which is provided in the second peripheral area 120-2, is positioned between the first pad portion P1 and the second pad portion P2. An anisotropic conductor 60 including fine conductive particles is inserted into the contact hole (CP), and the first pad portion P1 and the second pad portion P2 are connected to each other through the anisotropic conductor 60. Resultantly, the first driving circuit portion 220 of the first driving substrate 200 and the second driving circuit portion 320 of the second driving substrate 300 are connected to each other through the first link wire 250, the seventh link wire 16, the first pad portion P1, the anisotropic conductor 60 of the contact hole (CP), the second pad portion P2, the eighth link wire 26, and the third link wire 340.

Hereinabove, it is exemplarily described that the display area 110 has a rectangular shape, but embodiments not limited thereto, and the display area 110 may have various shapes such as a polygonal shape, a circular shape, an oval shape, etc. In addition, sides of the display area 110 may border the peripheral areas 120-1, 120-2, 120-3, and 120-4, and they may form a straight line or a curved line according to a shape of the display area 110.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope as set forth in the following claims.

What is claimed is:

1. A display device, comprising:
    a display substrate including a display area, a first peripheral area, and a second peripheral area, the display area having a first side and a second side extending in directions crossing each other, the first peripheral area being adjacent to the first side, and the second peripheral area being adjacent to the second side;
    a first driving substrate attached to the first peripheral area, the first driving substrate including a first driving circuit portion and a first link wire connected to the first driving circuit portion;
    a second driving substrate attached to the second peripheral area, the second driving substrate including a second driving circuit portion and a second link wire connected to the second driving circuit portion; and
    a flexible circuit board attached to the first driving substrate, the flexible circuit board including a third link wire connected to the first link wire and to the second link wire.

2. The display device as claimed in claim 1, wherein the first peripheral area and the second peripheral area are folded to a rear surface of the display substrate.

3. The display device as claimed in claim 1, wherein the display area includes a plurality of gate lines extending in a first direction, and the second driving circuit portion is connected to the plurality of gate lines.

4. The display device as claimed in claim 1, wherein the display area includes a plurality of data lines extending in a second direction, and the first driving circuit portion is connected to the plurality of data lines.

5. The display device as claimed in claim 1, wherein the first driving substrate includes a first signal input wire connected to the first driving circuit portion, and the flexible circuit board includes a second signal input wire connected to the first signal input wire.

6. The display device as claimed in claim 1, wherein:
    the display substrate includes a third peripheral area adjacent to a third side of the display area, the third side of the display area facing the second side with the display area therebetween, and the display device further includes a third driving substrate attached to the third peripheral area, the third driving substrate including a sixth link wire connected to a third driving circuit portion and the first driving circuit portion.

7. The display device as claimed in claim 6, wherein:

the first driving substrate includes a fourth link wire connected to the first driving circuit portion, and the flexible circuit board includes a fifth link wire connected to the fourth link wire and the sixth link wire.

\* \* \* \* \*